US009090982B2

(12) United States Patent
Urgeghe et al.

(10) Patent No.: US 9,090,982 B2
(45) Date of Patent: Jul. 28, 2015

(54) ELECTRODE FOR ELECTROLYTIC PROCESSES WITH CONTROLLED CRYSTALLINE STRUCTURE

(75) Inventors: Christian Urgeghe, Segrate (IT); Stefania Mora, Cassano d'Adda (IT); Antonio Lorenzo Antozzi, Merate (IT)

(73) Assignee: INDUSTRIE DE NORA S.P.A., Milan (IT)

( * ) Notice: Subject to any disclaimer, the term of this patent is extended or adjusted under 35 U.S.C. 154(b) by 506 days.

(21) Appl. No.: 13/427,153

(22) Filed: Mar. 22, 2012

(65) Prior Publication Data

US 2012/0175270 A1    Jul. 12, 2012

Related U.S. Application Data

(63) Continuation of application No. PCT/EP2010/064081, filed on Sep. 23, 2010.

(30) Foreign Application Priority Data

Sep. 23, 2009   (IT) .............................. MI2009A1621

(51) Int. Cl.
*C25B 11/00*   (2006.01)
*C25B 11/04*   (2006.01)
*C23C 14/02*   (2006.01)
*C23C 14/16*   (2006.01)

(52) U.S. Cl.
CPC ........... *C25B 11/0447* (2013.01); *C23C 14/021* (2013.01); *C23C 14/025* (2013.01); *C23C 14/165* (2013.01); *C25B 11/0473* (2013.01)

(58) Field of Classification Search
CPC .... C25B 11/00; C25B 11/04; C25B 11/0405; C25B 11/041; C25B 11/0415; C25B 11/0442; C25B 11/0447; C25B 11/0473; C25B 11/0478; C25B 11/0494
USPC ............... 204/280, 290.01, 290.14, 291, 292; 205/637, 638
See application file for complete search history.

(56) References Cited

U.S. PATENT DOCUMENTS

| | | | | |
|---|---|---|---|---|
| 6,171,460 B1 * | 1/2001 | Bill | .............................. | 204/291 |
| 6,352,625 B1 * | 3/2002 | Andolfatto et al. | ...... | 204/290.12 |
| 7,001,494 B2 * | 2/2006 | Jovic et al. | ..................... | 204/252 |
| 7,740,827 B2 * | 6/2010 | Felthouse et al. | ............. | 423/522 |
| 8,183,174 B2 * | 5/2012 | Valdez et al. | ................. | 502/325 |
| 8,221,599 B2 * | 7/2012 | Chidsey et al. | ............... | 204/284 |

FOREIGN PATENT DOCUMENTS

| | | |
|---|---|---|
| GB | 1307956 A | 2/1973 |
| GB | 2058842 A | 4/1981 |

OTHER PUBLICATIONS

Aaltonen et al. (Chemical Vapor Deposition, 2004, 10, 4).*
Zhitomirsky I , Et Al. : "Ruthenium oxide deposits prepared by cathodic electrosynthesis", Materials Letters, North Holland Publishing Company. Amsterdam, NL.
Cornell, A Et Al.: Ruthenium dioxide as cathode material for hydrogen evolution in hydroxide and chlorate solutions , Journal of the Electrochemical Society, Electrochemical Society. Manchester, New Hampshire, US LNKD.
Kolawa E et al.: "Reactive sputtering of RuO2 films", Thin Solid Films, Elsevier-Sequoia S. A. Lausanne, CH LNKD.
Liao et al.: Preparation and characteristics of ruthenium dioxide for pH array sensors with real-time measurement system, Sensors and Actuators B, Elsevier Sequoia S. A. , Lausanne, CH LNKD.
S. B. Basame, D. Habel-Rodriguez, D. J, Leller: Morphology and surface reconstruction on RuO2 single crystals, Applied Surface Science.
M. Z. Figueroa Torres, M. Hesiquio Guarduno, E. M. Arce Estrada, J. R. Vargas Garcia: Ruthenuim-Iridium Oxide Films Prepared by MOVCD and their Electrocatalytic Activity for Oxygen Evolution.
International Search Report for Application No. PCT/EP2010/064081 dated Mar. 9, 2011.

* cited by examiner

*Primary Examiner* — Luan Van
*Assistant Examiner* — Alexander W Keeling
(74) *Attorney, Agent, or Firm* — Lucas & Mercanti, LLP

(57) ABSTRACT

The invention relates to a cathode for electrolytic processes provided with a catalytic coating based on ruthenium crystallites with highly controlled size falling in a range of 1-10 nm. The coating can be produced by physical vapor deposition of a ruthenium or ruthenium oxide layer.

4 Claims, No Drawings

US 9,090,982 B2

ELECTRODE FOR ELECTROLYTIC PROCESSES WITH CONTROLLED CRYSTALLINE STRUCTURE

CROSS-REFERENCE TO RELATED APPLICATION

This application is a continuation of PCT/EP2010/064081 filed Sep. 23, 2010, that claims the benefit of the priority date of Italian Patent Application No. MI2009A001621 filed Sep. 23, 2009, the contents of which are herein incorporated by reference in their entirety.

FIELD OF THE INVENTION

The invention relates to an electrode for electrolytic processes and a method of manufacturing thereof.

BACKGROUND OF THE INVENTION

The use of metallic electrodes provided with catalytic coatings in electrolytic applications is known in the art. Electrodes comprising a metal base (for instance made of titanium, zirconium or other valve metals, nickel, stainless steel, copper or alloys thereof) equipped with a coating based on noble metals or alloys thereof are, for instance, used as hydrogen-evolving cathodes in water or chlor-alkali electrolysis processes. In the case of cathodes for hydrogen electrolytic evolution, particularly relevant are coatings containing ruthenium, as metal or more frequently as ruthenium oxide, optionally in admixture with valve metal oxides. Electrodes of such kind may be produced by thermal processes, through the decomposition of precursor solutions of the metals to be deposited by suitable thermal treatments, or less frequently by galvanic electrodeposition from suitable electrolytic baths.

These preparation methods are capable of producing ruthenium catalysts characterised by a great variability of crystal lattice parameters, presenting a fair catalytic activity towards hydrogen evolution reaction, non perfectly correlated with the crystallite average size. The best catalysts produced by thermal decomposition of salt precursor solutions can, for instance, present a crystal average size of about 10-40 nm with a standard deviation of 2-3 nm, the relevant catalytic activity being moderately increased for samples at the lower end of the range.

In an industrial electrolytic process, the catalytic activity of the electrodes is directly reflected on the operating voltage of the electrolysers, and therefore on energy consumption. For this reason, it would be desirable to obtain catalysts with an increased activity towards gas evolution reactions, for instance towards the reaction of cathodic hydrogen evolution.

SUMMARY OF THE INVENTION

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter. As provided herein, the invention comprises, under one aspect an electrode for hydrogen evolution comprising a metal substrate provided with a superficial catalytic coating containing crystallites of ruthenium in the form of metal or of oxide, having a size of 1 to 10 nm with a standard deviation not higher than 0.5 nm as obtained by repeating the measurement in a different zones of said superficial catalytic coating.

In another aspect, the invention comprises a method for manufacturing an electrode comprising the deposition of a catalytic coating by means of a chemical or physical vapour deposition technique from a ruthenium target, the catalytic coating comprising crystallites of ruthenium in the form of metal or of oxide, having a size of 1 to 10 nm with a standard deviation not higher than 0.5 nm as obtained by repeating the measurement in a different zones of the superficial catalytic coating.

In a further aspect, the invention comprises the use of an electrode for cathodic evolution of hydrogen in an electrolytic process, the electrode comprising a metal substrate provided with a superficial catalytic coating containing crystallites of ruthenium in the form of metal or of oxide, having a size of 1 to 10 nm with a standard deviation not higher than 0.5 nm as obtained by repeating the measurement in a different zones of said superficial catalytic coating.

To the accomplishment of the foregoing and related ends, the following description sets forth certain illustrative aspects and implementations. These are indicative of but a few of the various ways in which one or more aspects may be employed. Other aspects, advantages, and novel features of the disclosure will become apparent from the following detailed description.

DESCRIPTION

The inventors surprisingly observed that hydrogen evolution reaction proceeds with improved kinetics if carried out on metal substrates provided with a superficial catalytic coating containing crystallites of ruthenium, in form of metal or of oxide, having very reduced and very narrow lattice parameters, for instance of size comprised in one embodiment between 1 and 10 nm, and in one embodiment between 1 to 5 nm, with a standard deviation not higher than 0.5 nm. Catalysts with these characteristics and with the usual noble metal loadings, for instance 5 to 12 g/m$^2$ of ruthenium expressed as metal, can be capable of decreasing the reduction potential of hydrogen of 20-30 mV with respect to the best catalysts of the prior art. In one embodiment, an electrode provided with a catalytic coating having a crystallite size of 1 to 10 nm, optionally 1 to 5 nm, with a standard deviation not higher than 0.5 nm, can be obtained by subjecting a metal substrate, for example a nickel substrate, to a chemical or physical vapour deposition treatment of ruthenium, wherein such deposition is suitably controlled so as to produce the desired lattice parameters.

The size of crystallites can be adjusted for instance by acting on the temperature of the metal substrate, on the degree of vacuum of the deposition process, on the energy level of an ion plasma used to bomb the substrate during the deposition phase or on several other parameters, specific of the various applicable techniques. In one embodiment, a physical vapour deposition of ruthenium is obtained by means of an IBAD technique, providing the generation of plasma at a pressure of 10$^{-6}$-10$^{-3}$ Pa, the extraction of ruthenium ions from targets of ruthenium metal arranged in the deposition chamber under the action of plasma assisted by an ion beam and the consequent bombardment of the substrate to be treated with a beam containing ruthenium ions at an energy of 1000 to 2000 eV. In one embodiment, the Ion Beam Assisted Deposition (IBAD) deposition is of dual type, that is preceded by a step of substrate cleaning by bombardment with in situ-generated argon ions at a lower energy level (200-500 eV).

In one embodiment, a physical vapour deposition of ruthenium is obtained by means of a MPS (Magnetron Plasma Sputtering) technique, providing the generation of high density plasma through the combined use of a magnetic field and a radiofrequency electric field, or by a DC Plasma Sputtering technique, providing the generation of high density plasma through the combined use of a magnetic field and modulated direct current.

In one embodiment, a physical vapour deposition of ruthenium in the form of an oxide, for instance, of non-stoichiometric dioxide characterised by particularly high catalytic activity and stability at the usual industrial electrolysis conditions, is obtained by means of a physical vapour deposition according to one of the above described methodologies carried out in the presence of a reactant gas, for instance oxygen, so as to produce the simultaneous oxidation of the deposited ruthenium. Alternatively, it is possible to deposit ruthenium directly from ruthenium oxide targets.

The inventors observed that the effect of size and regularity of the crystallites on the reaction kinetics is significant, especially for the outermost portion of the catalyst, directly in contact with the process electrolyte. Hence, in one embodiment, a hydrogen-evolving electrode comprises a substrate coated with an intermediate catalytic coating of ruthenium dioxide which can be prepared galvanically or by thermal decomposition of salt precursors, whereon a superficial catalytic coating is applied comprising crystallites of ruthenium, in metal or oxide form, having a size of 1 to 10 nm, more preferably 1 to 5 nm, with a standard deviation not higher than 0.5 nm, wherein such coating can be prepared by chemical or physical vapour deposition. In one embodiment, the intermediate catalytic coating has a specific loading of 5-12 $g/m^2$ of ruthenium expressed as metal, and the superficial catalytic coating has a specific loading of 1-5 $g/m^2$ of ruthenium expressed as metal. This can have the advantage of allowing the application of the main amount of catalyst by a quicker and cheaper method, using the PVD or CVD techniques only to deposit the outermost layer which is more affected by the benefits of a controlled size distribution of the crystallites.

Some of the most significant results obtained by the inventors are presented in the following examples, which are not intended as a limitation of the extent of the invention.

EXAMPLE 1

A flattened mesh of nickel 200 of 1000 mm×500 mm×0.89 mm size was subjected to a blasting treatment with corundum until obtaining a controlled roughness, with an $R_z$ value of 70 μm. The blasted mesh was then etched in 20% boiling HCl to eliminate possible corundum residues.

The thus-treated mesh was loaded in a Magnetron Plasma Sputtering device of the type provided with a conditioning chamber operated at a first vacuum level (typically $10^{-3}$ Pa) and with a deposition chamber operated at high vacuum, equipped with a ruthenium metal target. Upon reaching a vacuum level of $5 \cdot 10^{-5}$ Pa in the deposition chamber, the generation of a pure Ar plasma was activated between the mesh and the chamber walls. Upon completion of this phase, aimed at obtaining a perfect cleaning of the surface, the generation of plasma was activated between the ruthenium target (99% w/w, 200 W nominal power, zero reflected power) simultaneously feeding a 20% oxygen in argon gas mixture thereby establishing a dynamic vacuum of $10^{-1}$ Pa. This triggered the onset of the reactive deposition of a $RuO_2$ layer. During the deposition, the sample holder housing the mesh was rotated to optimise the homogeneity. The deposition was repeated on the opposite side of the mesh, until obtaining a total loading of 9 $g/m^2$ of Ru expressed as metal. The ex situ measurement of crystallite size, mediated according to Scherrer across a 4 $cm^2$ surface, showed a value of 4.0 nm. By repeating the measurement in different zones of the samples, the standard deviation obtained was 0.5 nm. A hydrogen evolution potential of −930 mV/NHE was detected in 32% caustic soda at a temperature of 90° C. and at a current density of 3 $kA/m^2$.

EXAMPLE 2

A flattened mesh of nickel 200 of 1000 mm×500 mm×0.89 mm size was subjected to a blasting treatment with corundum until obtaining a controlled roughness, with an $R_z$ value of 70 μm. The blasted mesh was then etched in 20% boiling HCl to eliminate possible corundum residues.

The thus-treated mesh was activated with 8 $g/m^2$ of ruthenium, expressed as metal, by thermal decomposition of a $RuCl_3 \cdot 3H_2O$ hydroalcoholic solution acidified with HCl. The solution was applied in four coats by spraying and subsequent thermal treatment in a vented oven at 480° C. for 10 minutes. After the last coat, a final thermal treatment of 1 hour at the same temperature was carried out.

The preactivated mesh was then loaded in a Magnetron Plasma Sputtering device analogous to the one of example 1. Upon reaching a vacuum level of $5 \cdot 10^{-5}$ Pa in the deposition chamber, the generation of a pure Ar plasma was activated between the mesh and the chamber walls. Upon completion of this surface cleaning phase, the generation of plasma was activated between the ruthenium target (99% w/w, 200 W nominal power, zero reflected power) simultaneously feeding a 20% oxygen in argon gas mixture thereby establishing a dynamic vacuum of $10^{-1}$ Pa. This triggered the onset of the reactive deposition of a $RuO_2$ layer. During the deposition, the sample holder housing the mesh was rotated to optimise the homogeneity. The deposition was repeated on the opposite side of the mesh, until obtaining a total loading of 4 $g/m^2$ of Ru expressed as metal. The ex situ measurement of crystallite size by low angle X-Ray diffraction technique showed a value of 4.0+/−0.5 nm. A hydrogen evolution potential of −930 mV/NHE was detected in 32% caustic soda at a temperature of 90° C. and at a current density of 3 $kA/m^2$.

Counterexample 1

A flattened mesh of nickel 200 of 1000 mm×500 mm×0.89 mm size was subjected to a blasting treatment with corundum until obtaining a controlled roughness, with an $R_z$ value of 70 μm. The blasted mesh was then etched in 20% boiling HCl to eliminate possible corundum residues.

The thus-treated mesh was activated with 12 $g/m^2$ of ruthenium, expressed as metal, by thermal decomposition of a $RuCl_3 \cdot 3H_2O$ hydroalcoholic solution acidified with HCl. The solution was applied in five coats by spraying and subsequent thermal treatment in a vented oven at 550° C. for 10 minutes. After the last coat, a final thermal treatment of 1 hour at the same temperature was carried out.

The ex situ measurement of crystallite size by low angle X-Ray diffraction technique showed a value of 20+/−2 nm. A hydrogen evolution potential of −950 mV/NHE was detected in 32% caustic soda at a temperature of 90° C. and at a current density of 3 $kA/m^2$.

Counterexample 2

A flattened mesh of nickel 200 of 1000 mm×500 mm×0.89 mm size was subjected to a blasting treatment with corundum until obtaining a controlled roughness, with an $R_z$ value of 70 µm. The blasted mesh was then etched in 20% boiling HCl to eliminate possible corundum residues.

The thus-treated mesh was activated with 13 g/m² of ruthenium, expressed as metal, by thermal decomposition of a $RuCl_3 \cdot 3H_2O$ hydroalcoholic solution acidified with HCl. The solution was applied in five coats by spraying and subsequent thermal treatment in a vented oven at 460° C. for 10 minutes. After the last coat, a final thermal treatment of 1 hour at the same temperature was carried out.

The ex situ measurement of crystallite size by low angle X-Ray diffraction technique showed a value of 16+/−2 nm. A hydrogen evolution potential of −945 mV/NHE was detected in 32% caustic soda at a temperature of 90° C. and at a current density of 3 kA/m².

Counterexample 3

A flattened mesh of nickel 200 of 1000 mm×500 mm×0.89 mm size was subjected to a blasting treatment with corundum until obtaining a controlled roughness, with an $R_z$ value of 70 µm. The blasted mesh was then etched in 20% boiling HCl to eliminate possible corundum residues.

The thus-treated mesh was then loaded in a Magnetron Plasma Sputtering device analogous to the one of example 1. While reaching a vacuum condition of $5 \cdot 10^{-5}$ Pa in the deposition chamber, the temperature of the sample was brought to 450° C. by means of an electric resistance. The generation of a pure Ar plasma was then activated between the mesh and the chamber walls. Upon completion of this surface cleaning phase, the generation of plasma was activated between the ruthenium target (99% w/w, 200 W nominal power, zero reflected power) simultaneously feeding a 20% oxygen in argon gas mixture thereby establishing a dynamic vacuum of $10^{-1}$ Pa. This triggered the onset of the reactive deposition of a $RuO_2$ layer. During the deposition, the sample holder housing the mesh was rotated to optimise the homogeneity. The deposition was repeated on the opposite side of the mesh, until obtaining a total loading of 9 g/m² of Ru expressed as metal. The ex situ measurement of crystallite size, mediated according to Scherrer across a 4 cm² surface, showed a value of 35 nm. By repeating the measurement in different zones of the samples, the standard deviation obtained was 0.5 nm. A hydrogen evolution potential of −962 mV/NHE was detected in 32% caustic soda at a temperature of 90° C. and at a current density of 3 kA/m².

The previous description is not intended to limit the invention, which may be used according to different embodiments without departing from the scopes thereof, and whose extent is univocally defined by the appended claims.

Throughout the description and claims of the present application, the term "comprise" and variations thereof such as "comprising" and "comprises" are not intended to exclude the presence of other elements or additives.

The discussion of documents, acts, materials, devices, articles and the like is included in this specification solely for the purpose of providing a context for the present invention. It is not suggested or represented that any or all of these matters formed part of the prior art base or were common general knowledge in the field relevant to the present invention before the priority date of each claim of this application.

What we claim is:

1. An electrode for hydrogen evolution comprising:
   a metal substrate; and
   a superficial catalytic coating provided on the metal substrate and containing crystallites of ruthenium in the form of metal or of oxide,
   an intermediate coating comprising RuO2 interposed between the metal substrate and the catalytic coating, wherein
   the crystallites have a size of 1 to 10 nm and a standard deviation not higher than 0.5 nm,
   the crystallites size and standard deviation are as obtained by repeating the measurement in different zones of said superficial catalytic coating, and
   the catalytic coating has a specific loading of ruthenium of 1 to 5 g/m2 and the intermediate coating has a specific loading of ruthenium of 5 to 12 g/m2.

2. The electrode according to claim 1, wherein the size of crystallites is 1 to 5 nm.

3. The electrode according to claim 1, wherein the metal substrate is made of nickel.

4. The electrode according to claim 1, wherein the crystallites of ruthenium are in form of non-stoichiometric oxide.

* * * * *